(12) United States Patent
Ogawa et al.

(10) Patent No.: US 11,626,680 B2
(45) Date of Patent: Apr. 11, 2023

(54) PIN PLUNGER AND IC SOCKET

(71) Applicant: Kioxia Corporation, Tokyo (JP)

(72) Inventors: Yoshinori Ogawa, Nakano (JP); Takashi Okamura, Kamakura (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/667,605

(22) Filed: Feb. 9, 2022

(65) Prior Publication Data

US 2023/0079600 A1     Mar. 16, 2023

(30) Foreign Application Priority Data

Sep. 13, 2021   (JP) .............................. JP2021-148676

(51) Int. Cl.
*H01R 13/24*      (2006.01)
*H01R 33/76*      (2006.01)

(52) U.S. Cl.
CPC ..... *H01R 13/2407* (2013.01); *H01R 33/7685* (2013.01)

(58) Field of Classification Search
CPC ............ H01R 13/2407; H01R 33/7685; H01R 13/2421; H01R 13/2428; H01R 12/7082
See application file for complete search history.

(56) References Cited

U.S. PATENT DOCUMENTS

| 6,183,267 | B1 * | 2/2001 | Marcus | H01R 12/52 439/91 |
| 6,827,584 | B2 * | 12/2004 | Mathieu | H01R 13/03 438/117 |
| 7,255,574 | B1 * | 8/2007 | Ju | H01R 13/2414 439/886 |
| 10,141,670 | B1 * | 11/2018 | Stevenot | H01R 13/2421 |

FOREIGN PATENT DOCUMENTS

| JP | 02-150773 | A | 6/1990 |
| JP | 04-121667 | A | 4/1992 |
| JP | 2013-246091 | A | 12/2013 |
| KR | 100905736 | B1 * | 7/2009 |

* cited by examiner

*Primary Examiner* — Oscar C Jimenez
*Assistant Examiner* — Paul D Baillargeon
(74) *Attorney, Agent, or Firm* — Oblon, McClelland, Maier & Neustadt, L.L.P.

(57) ABSTRACT

According to a certain embodiment, a pin plunger includes: a first contact member; a second contact member that faces the first contact member and is apart from the first contact member; a spring arranged between the first contact member and the second contact member; and a housing that houses the first contact member, the second contact member, and the spring. The housing comprises a bimetal inside or outside the housing. The bimetal comprises a first metal and a second metal, the first metal having a thermal expansion coefficient different from a thermal expansion coefficient of the second metal. The elastic force decreased or increased by contracting or expanding of the spring due to a temperature change is compensated with a warping force due to stretching of the first metal and the second metal.

20 Claims, 16 Drawing Sheets

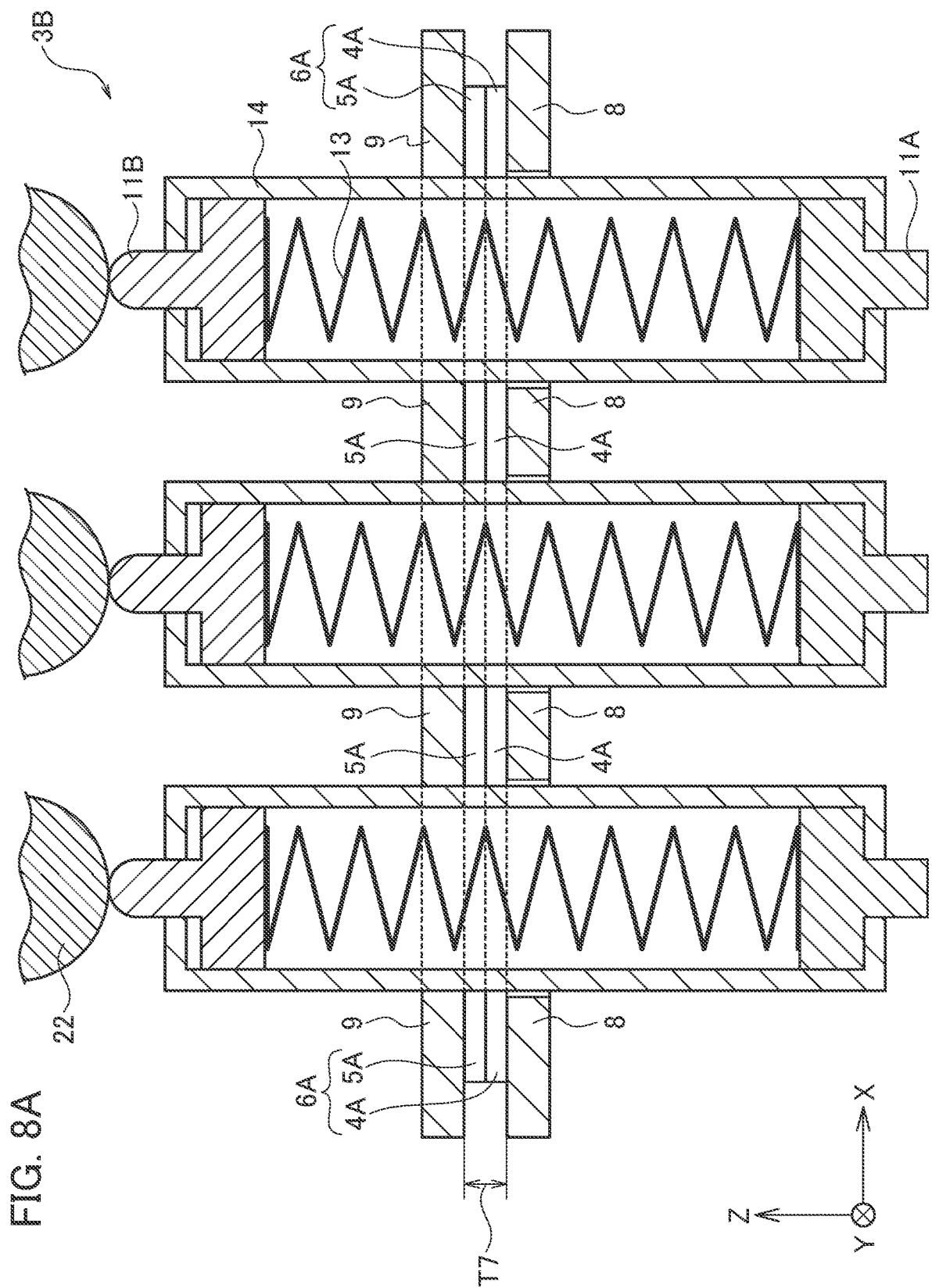

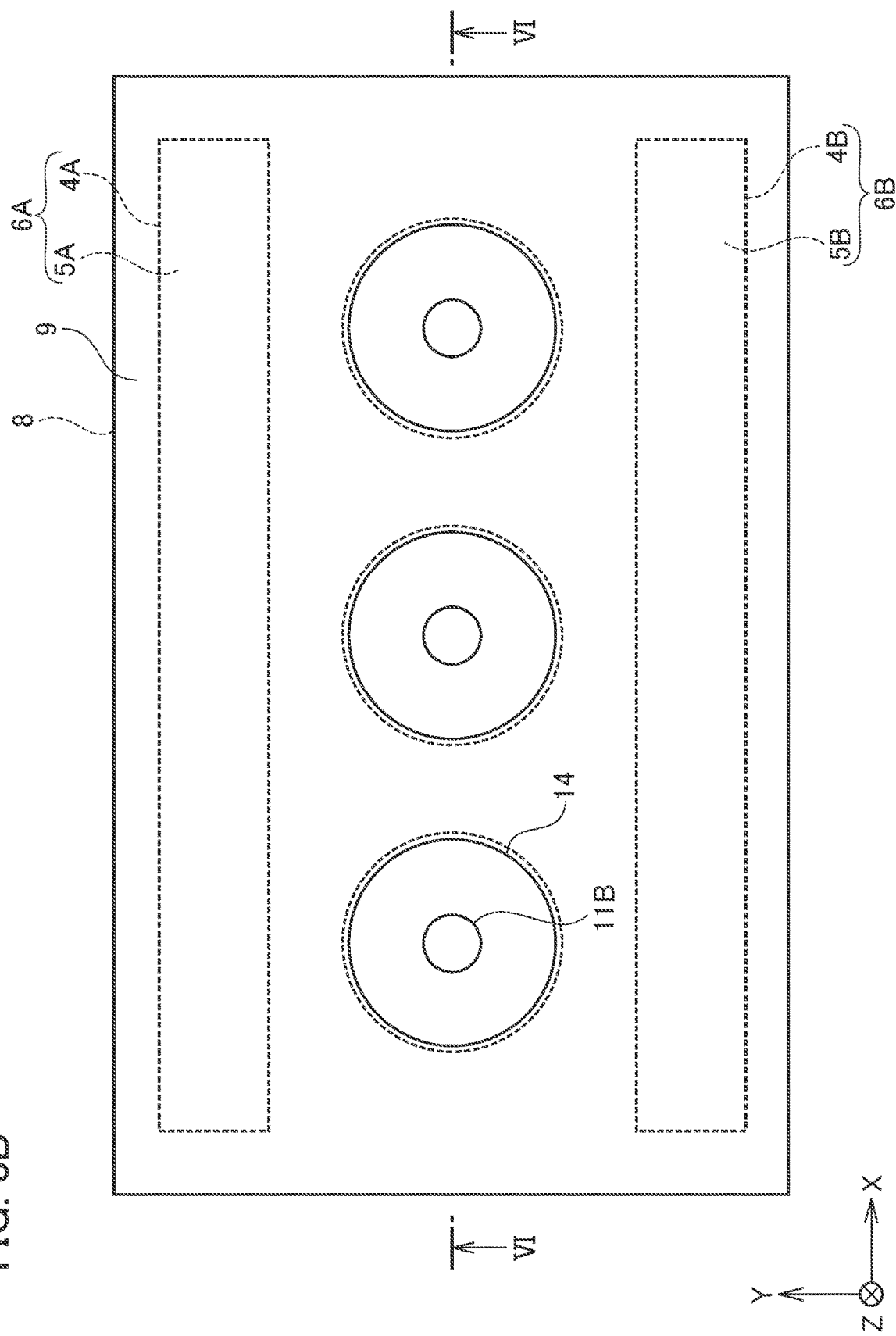

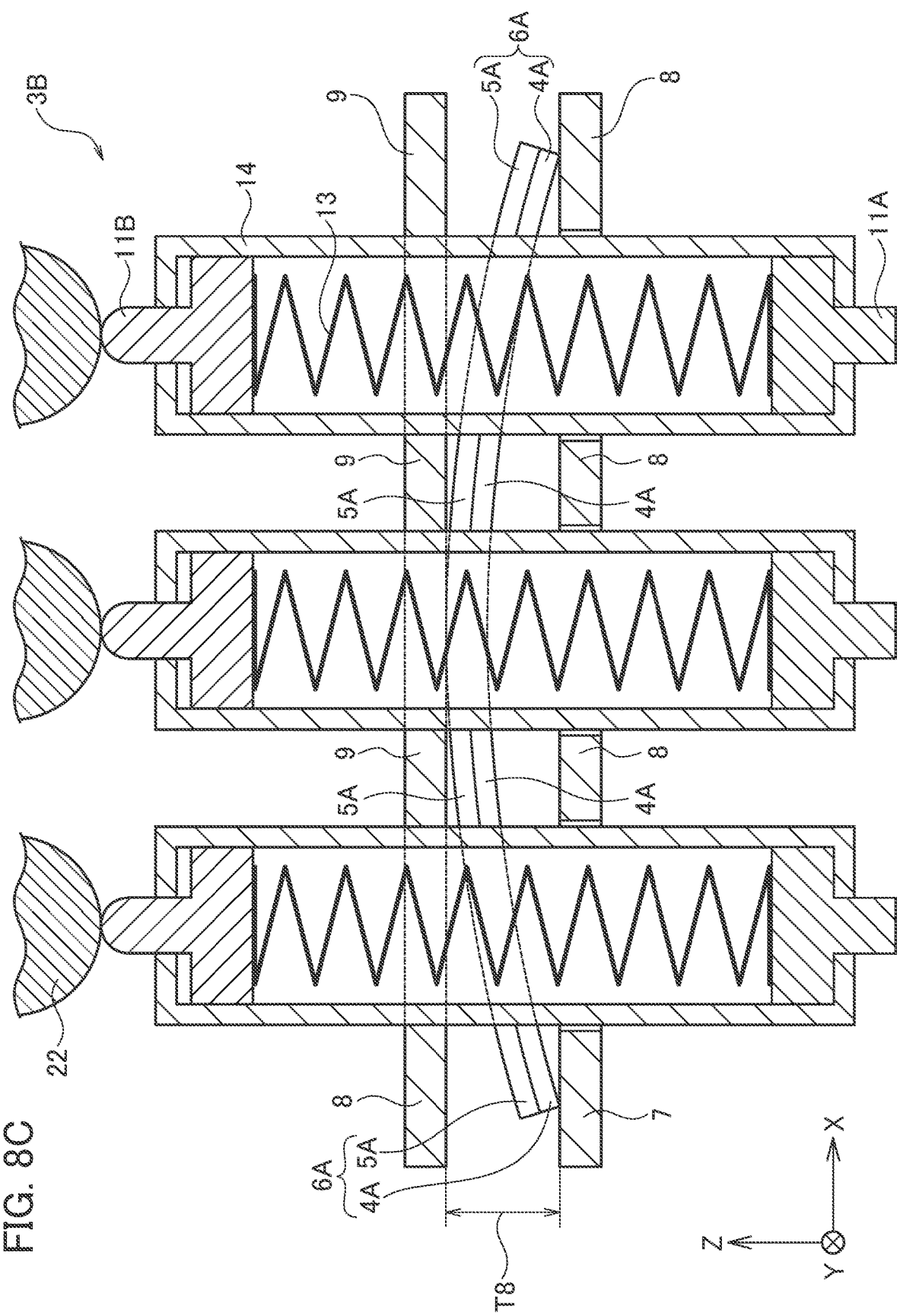

PIN PLUNGER AND IC SOCKET

CROSS REFERENCE TO RELATED APPLICATIONS

This application is based upon and claims the benefit of priority from prior Japanese Patent Application No. P2021-148676 filed on Sep. 13, 2021, the entire contents of which are incorporated herein by reference.

FIELD

Embodiments described herein relate to a pin plunger and an IC socket.

BACKGROUND

An integrated circuit (IC) socket is generally known to have a pin plunger in a contact member. The contact member includes a signal line that transmits data to a semiconductor device or a power line that supplies power. A spring in the pin plunger expands or contracts due to temperature changes. Therefore, the contact pressure between a terminal of the semiconductor device and the pin plunger of the IC socket may become unstable.

BRIEF DESCRIPTION OF THE DRAWINGS

FIG. 8A is a schematic cross sectional view of a pin plunger according to a second embodiment.

FIG. 8B is a plan view of FIG. 8A.

FIG. 8C is a cross sectional view of a pin plunger according to a second embodiment at a low temperature.

DETAILED DESCRIPTION

Figure 1:
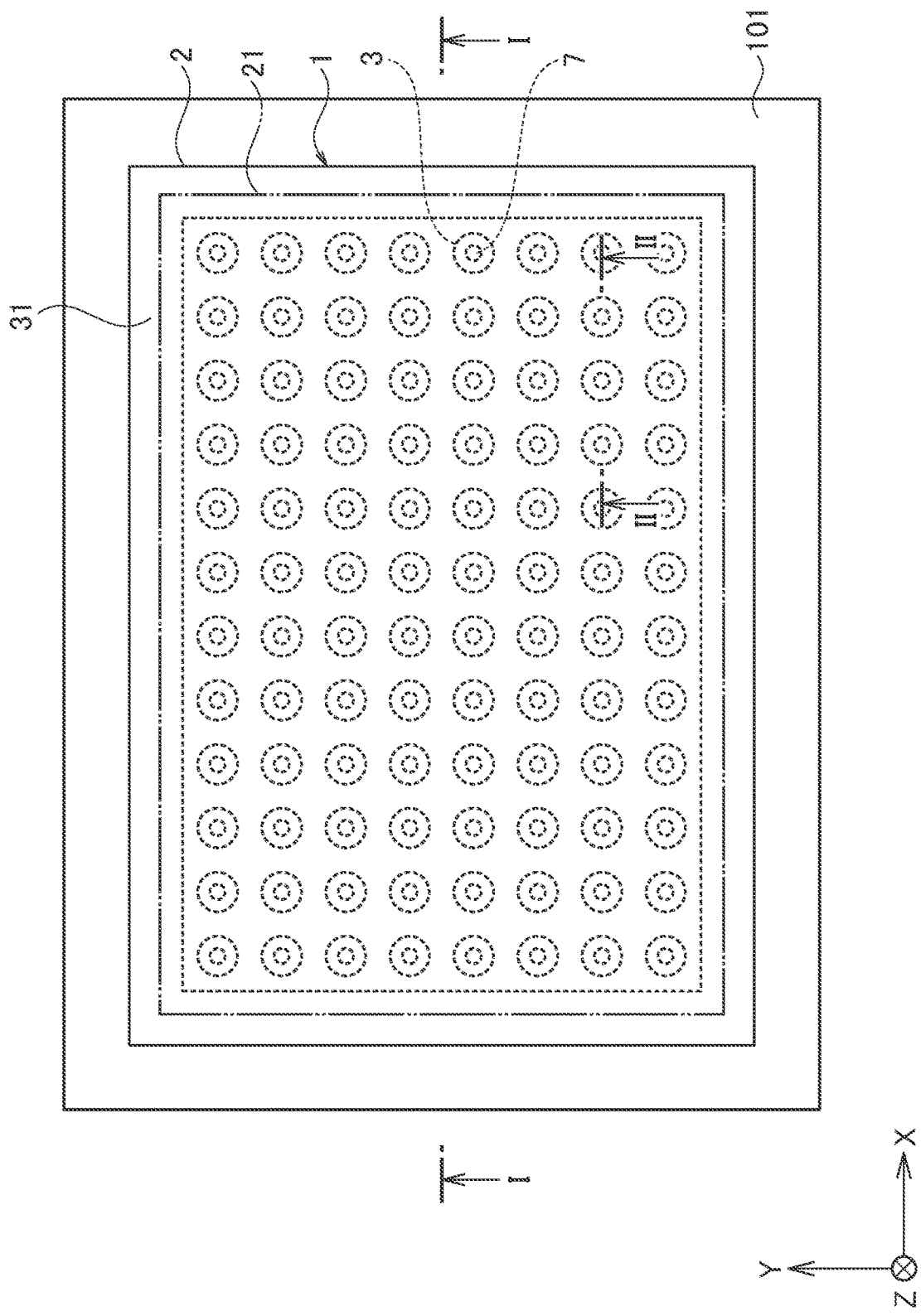
FIG. 1 is a schematic plan view showing the layout of an IC socket according to a first embodiment.

Next, certain embodiments will now be described with reference to the drawings. In the description of the following drawings to be explained, identical or similar parts are denoted by identical or similar reference numerals. However, it should be noted that the drawings are schematic.

Moreover, the embodiments described hereinafter merely exemplify the device and method for materializing the technical idea, and the embodiments do not specify the material, shape, configuration, placement, and the like of each component part as the following. The embodiments may be changed without departing from the spirit or scope of claims. In the following description, a semiconductor device, an integrated circuit package, and the like are collectively referred to as an "IC (integrated circuit)". Further, a socket which houses the IC for applying a voltage to or testing the IC is called an IC socket 1.

The present embodiment provides a pin plunger that stabilizes contact pressure, and an IC socket.

According to a certain embodiment, a pin plunger includes: a first contact member; a second contact member that faces the first contact member and is apart from the first contact member; a spring that arranged between the first contact member and the second contact member; and a housing that houses the first contact member, the second contact member, and the spring. The housing comprises a bimetal inside or outside the housing. The bimetal comprises a first metal and a second metal, the first metal having a thermal expansion coefficient different from a thermal expansion coefficient of the second metal. The elastic force decreased or increased by contracting or expanding of the spring due to a temperature change is compensated with a warping force due to stretching of the first metal and the second metal.

First Embodiment (Configuration of IC Socket)

Figure 2:
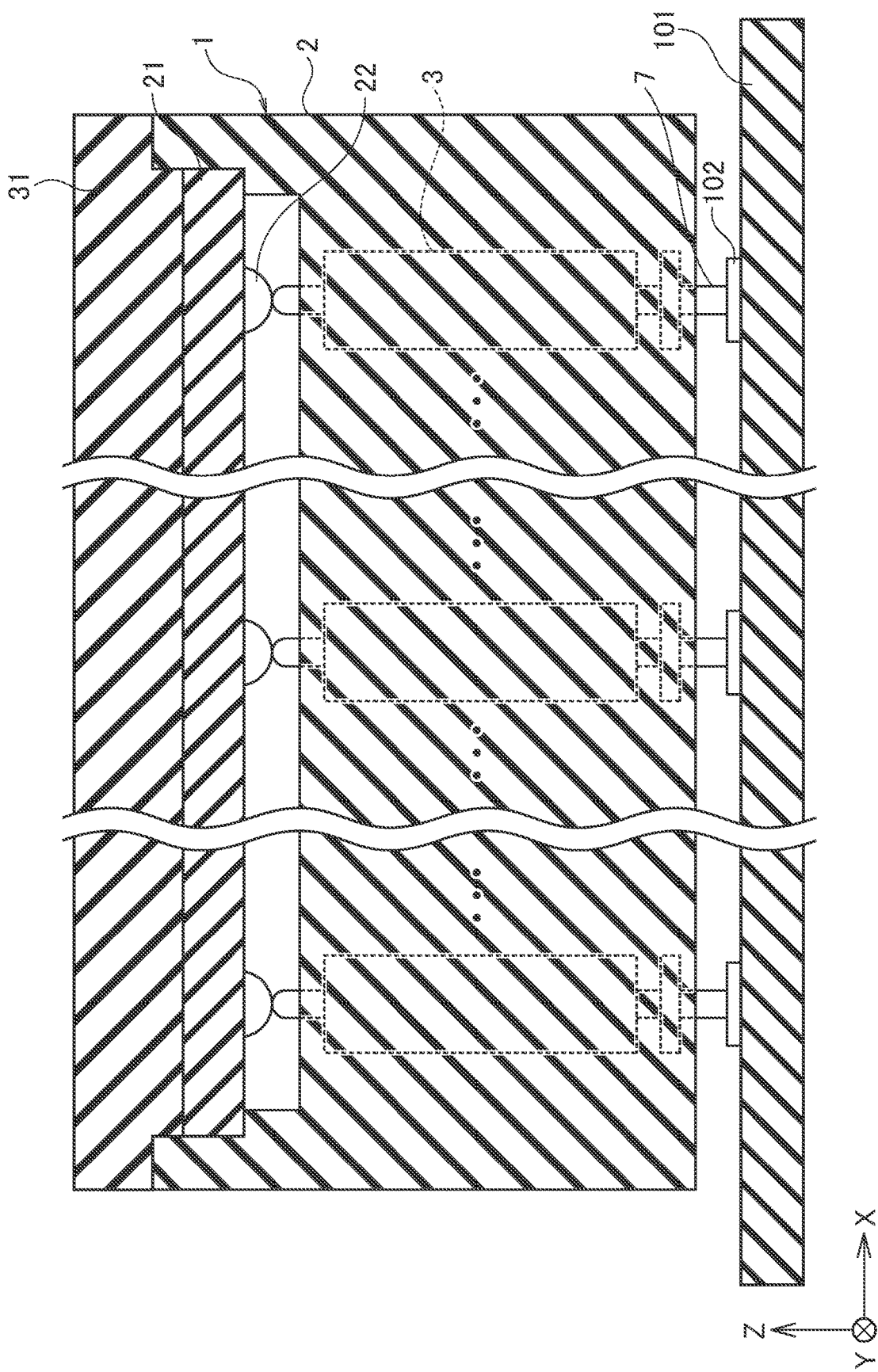
FIG. 2 is a cross sectional view taken along line I-I of FIG. 1.
Figure 3:
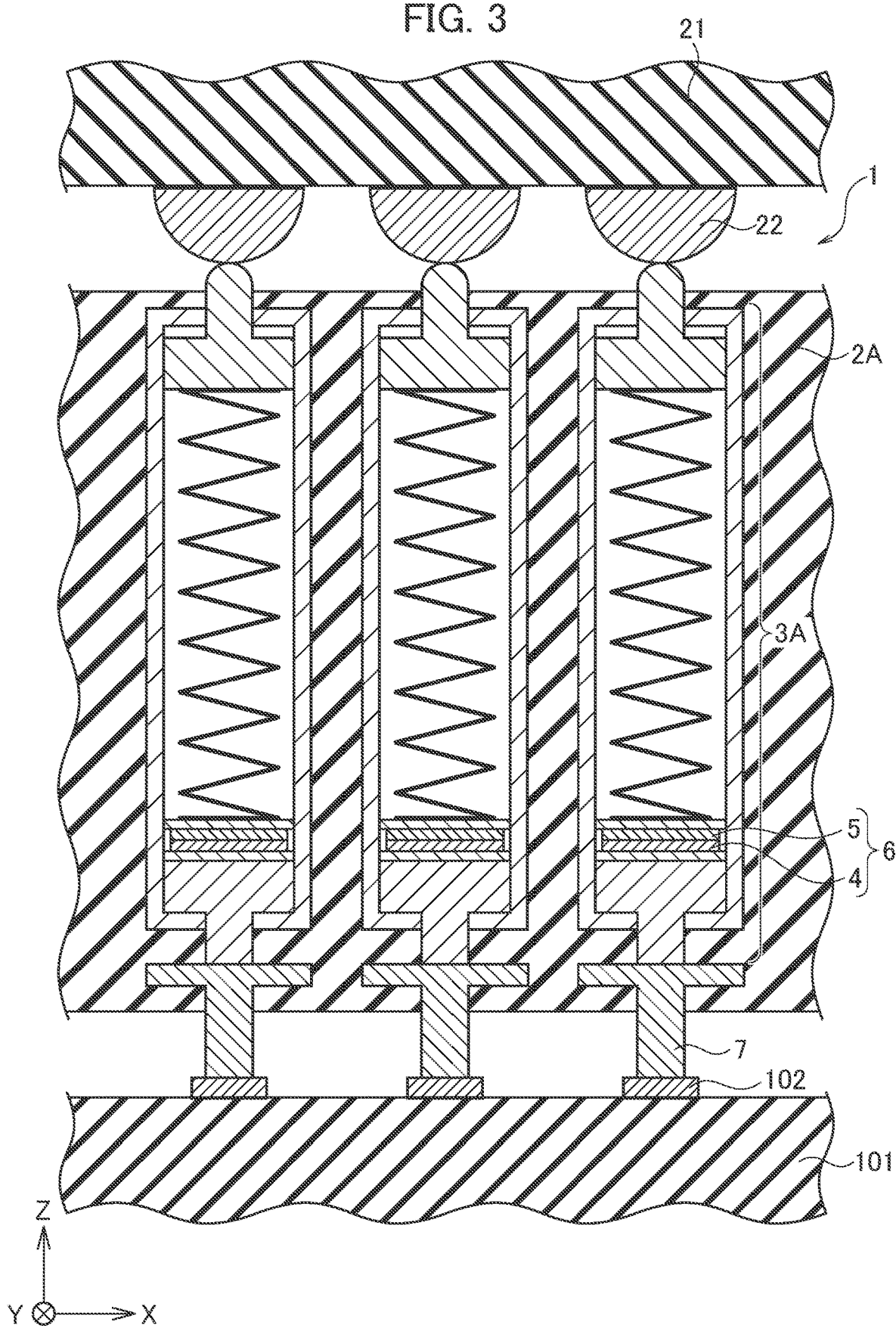
FIG. 3 is a cross sectional view taken along line II-II of FIG. 1.

FIG. 1 shows an IC socket according to an embodiment. FIG. 1 is a schematic plan view showing the layout of an IC socket 1 according to a first embodiment. Further, FIG. 2 is a cross sectional view taken along line I-I of FIG. 1. FIG. 3 is a cross sectional view taken along line II-II of FIG. 1. In FIG. 3, a socket cover 31 is omitted. The X direction is the long-side direction of the IC socket 1. The Y direction orthogonal to the X direction is the short-side direction of the IC socket 1. The Z direction is perpendicular to the X-Y plane.

The IC socket 1 includes a socket body 2 and a wiring board 101 as shown in FIG. 1. The socket body 2 has a rectangular recess which houses a semiconductor device 21 which is an example of an IC in plan view. The semiconductor device 21 includes solder balls 22 which are not shown in FIG. 1. Pin plungers 3 and socket pins 7 are provided in the rectangular recess of the socket body 2 in a predetermined arrangement. The predetermined arrangement here refers to the pin plungers 3 being arranged under the solder balls 22 such that the solder balls 22 and the pin plungers 3 come into contact with each other, for example, as shown in FIGS. 2 and 3. A socket cover 31 which fixes the semiconductor device 21 is arranged at an upper portion of the socket body 2.

As shown in FIG. 2, the IC socket 1 includes the wiring board 101, the socket pins 7, the pin plungers 3, and the socket body 2.

The wiring board 101 can be configured by using, for example, a printed circuit board. The wiring board 101 includes wiring 102, as shown in FIG. 2.

The socket pins 7 are formed of a metal having good conductivity, for example. Specifically, gold (Au), silver (Ag), copper (Cu), aluminum (Al), and the like can be applied. Each socket pin 7 is arranged on a piece of wiring 102. Further, each socket pin 7 is formed of a portion extending in the X direction and a portion extending in the Z direction as shown in FIGS. 2 and 3. Still further, each socket pin 7 is electrically connected to a piece of wiring 102.

Each pin plunger (3 and 3A) is arranged on a socket pin 7 as shown in FIGS. 2 and 3. Further, each pin plunger (3 and 3A) is electrically connected to a socket pin 7 and a solder ball 22 as shown in FIGS. 2 and 3. The configuration of each pin plunger (3 and 3A) will be described in detail, for example, in the description of FIG. 4A.

The socket body (2 and 2A) is formed of an insulating member. Specifically, plastic, or the like is applicable. The socket body (2 and 2A) includes the socket pins 7 and the pin plungers (3 and 3A) inside the socket body 2 as shown in FIGS. 2 and 3.

(Configuration of Pin Plunger)

Figure 4A:
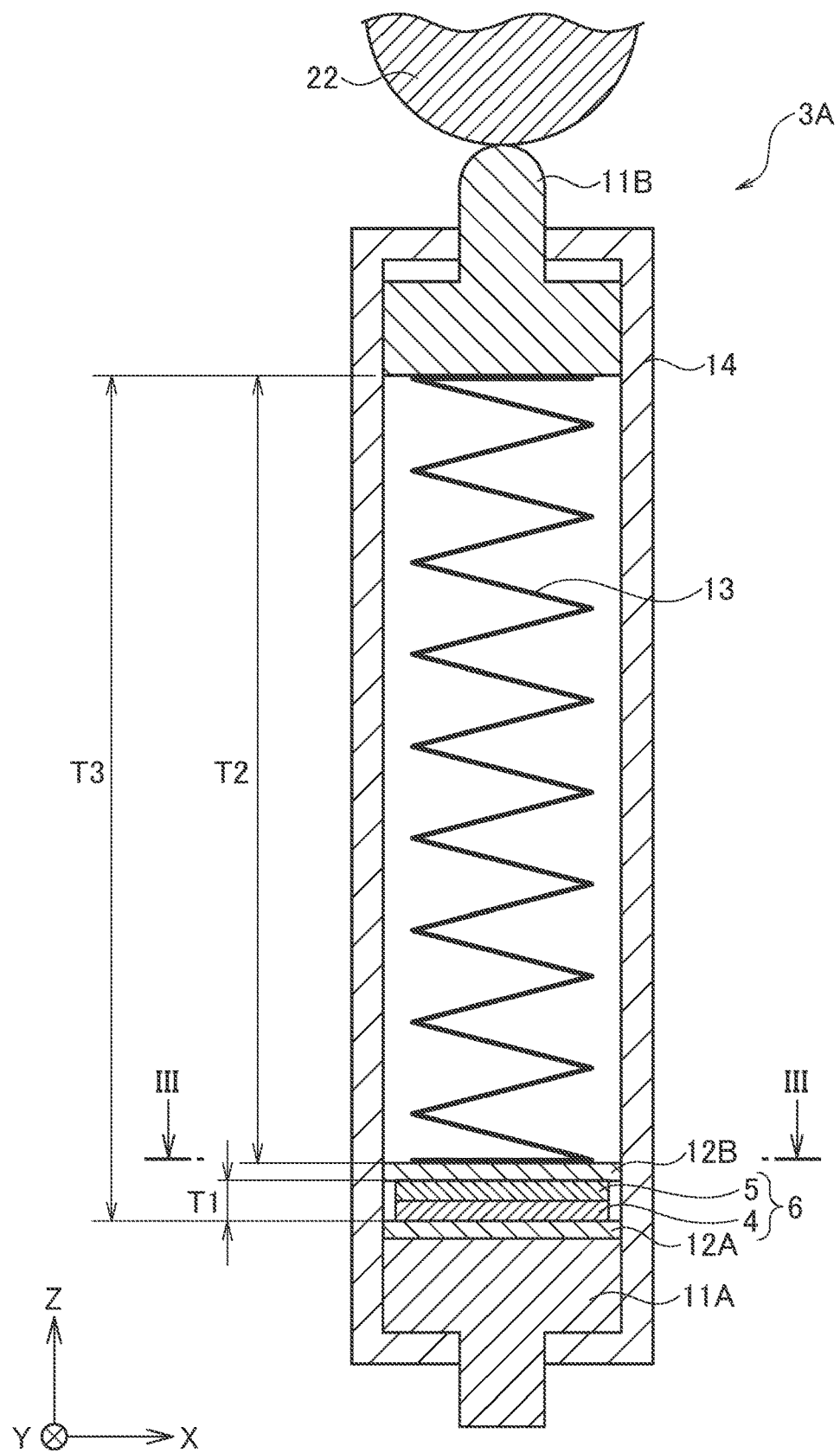
FIG. 4A is a cross sectional view of a pin plunger according to a first embodiment.
Figure 4B:
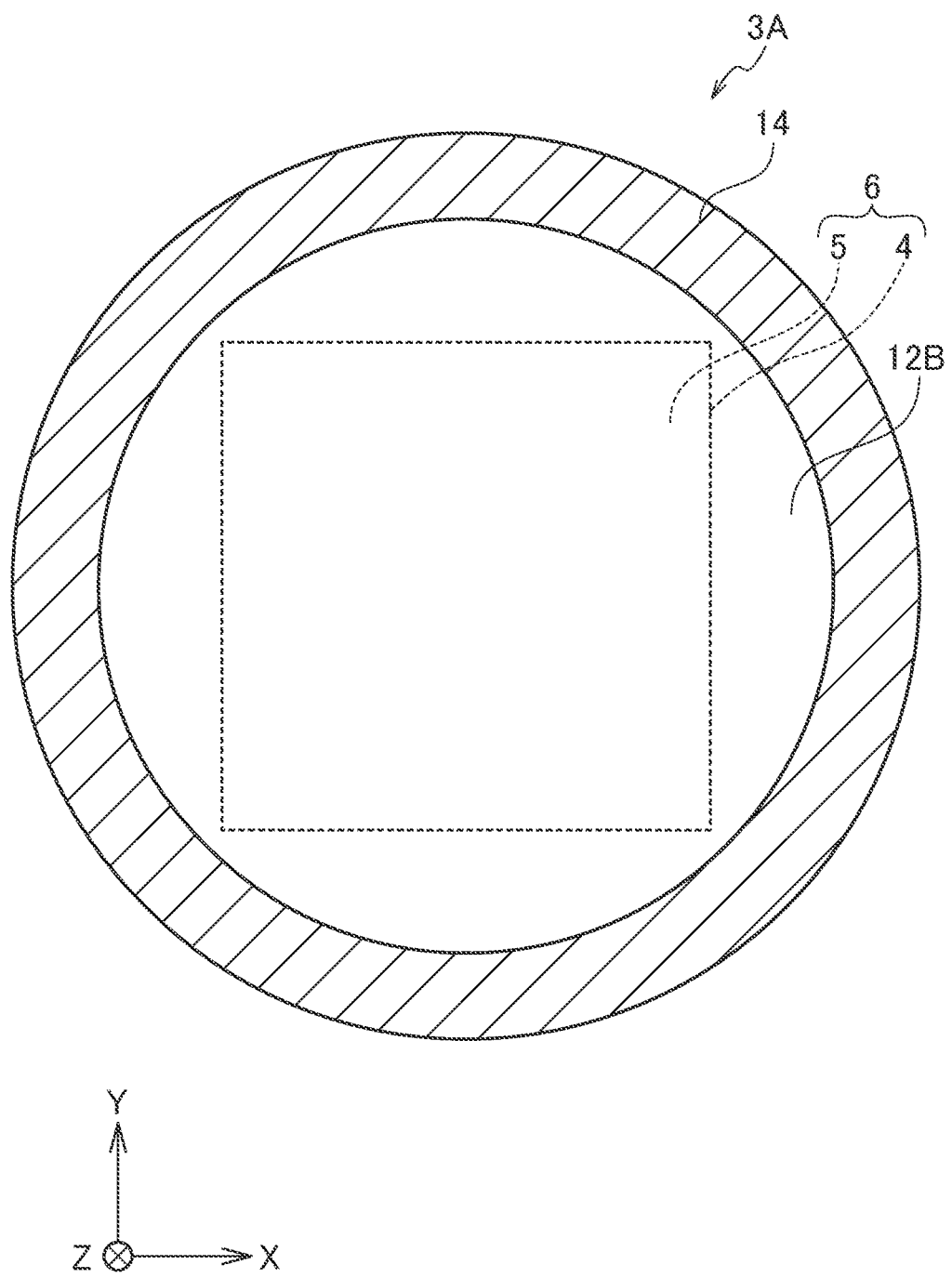
FIG. 4B is a plan view taken along line III-III of FIG. 4A.
Figure 4C:
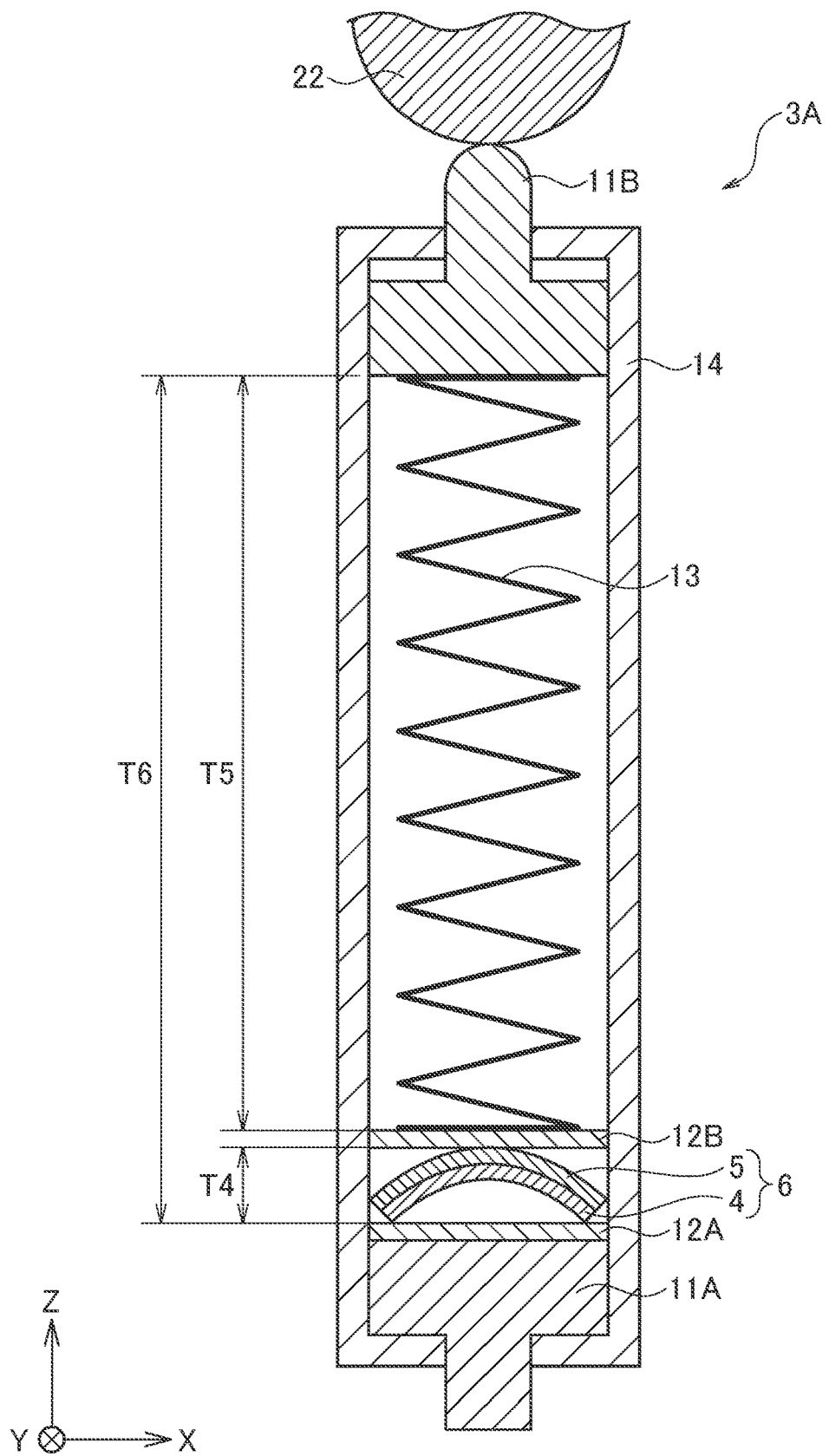
FIG. 4C is a cross sectional view of a pin plunger according to a first embodiment at a low temperature.

FIG. 4A is an example of a cross sectional view of a pin plunger 3A according to the first embodiment. FIG. 4B is a plan view taken along line of FIG. 4A. FIG. 4C is an example of a cross sectional view of the pin plunger 3A according to the first embodiment at a low temperature. In the following description, a low temperature is a temperature at which each spring 13 is cooled and contracted, for example, and the ambient temperature in this case is about 0° C. to −40° C. FIGS. 4A and 4B show the shape of the pin plunger when the ambient temperature is at room temperature. In the following description, room temperature is a temperature at which the shape of the spring 13 does not change, for example, and the ambient temperature in this case is about 1° C. to 30° C. A high temperature is a temperature at which the spring 13 is heated and expanded, for example, and the ambient temperature in this case is about 31° C. to 160° C.

(Shape of Pin Plunger at Room Temperature)

As shown in FIG. 4A, the pin plunger 3A includes a first contact member 11A, a second contact member 11B, the spring 13, and a housing 14. In the housing 14, the first contact member 11A, the second contact member 11B, the spring 13, plates (12A and 12B), and a bimetal 6 are arranged. A current that flows through the pin plunger 3A mainly flows from the solder ball 22 to the housing 14 with the second contact member 11B therebetween, for example. Further, the current that flows through the pin plunger 3A mainly flows from the housing 14 to the socket pin 7 (not shown) with the first contact member 11A therebetween, for example.

The first contact member 11A is formed of a metal having good conductivity. Specifically, gold (Au), silver (Ag), copper (Cu), aluminum (Al), and the like can be applied. As shown in FIG. 4A, the first contact member 11A is arranged at a lower portion of the housing 14 in the Z direction.

The plates (12A and 12B) are formed of a metal or insulating substrate. The plate 12A is arranged on the first contact member 11A as shown in FIG. 4A. The plate 12B is arranged on the bimetal 6. Specifically, suppose that the shape of the bimetal 6 changes due to a temperature change. Even in the above case, the flatness of the plates (12A and 12B) can be maintained in the housing 14 in the X and Y directions.

The bimetal 6 includes a first metal 4 and a second metal 5. The first metal 4 and the second metal 5 are formed of metal materials having different thermal expansion coefficients from each other. As shown in FIG. 4A, the bimetal 6 is obtained by bonding and arranging the second metal 5 on the first metal 4. The bimetal 6 is arranged on the plate 12A. As shown in FIG. 4A, the thickness T1 of the bimetal 6 in the Z direction is the sum of the thickness of the first metal 4 and the thickness of the second metal 5 in the Z direction. In the following description, the bonding of the first metal and the second metal is also referred to as bonding.

The first metal 4 is formed of a metal material having a larger thermal expansion coefficient than the second metal 5. As the first metal 4 (high expansion material), a metal or the like which is obtained by adding at least one kind of manganese (Mn), chromium (Cr), copper (Cu), and the like to an alloy of iron (Fe) and nickel (Ni) can be applied, for example. As the second metal 5 (low expansion material), a metal or the like which is obtained by adding at least one kind of platinum (Pt), lead (Pb), chromium, and the like to an alloy of iron (Fe) and nickel (Ni) can be applied.

The spring 13 is arranged on the plate 12B. Further, the spring 13 is arranged between the first contact member 11A and the second contact member 11B. The length T2 of the spring 13 in the Z direction is equal to the length of a space between the plate 12B and the second contact member 11B as shown in FIG. 4A.

The length T3 in the Z direction is the length of a space between the plate 12A and the second contact member 11B at room temperature. As shown in FIG. 4A, the length T3 is specifically the sum of the thickness T1 of the bimetal 6 in the Z direction, the thickness of the plate 12B in the Z direction, and the length T2 of the spring 13 in the Z direction.

The second contact member 11B is formed of a metal having good conductivity. Specifically, gold (Au), silver (Ag), copper (Cu), aluminum (Al), and the like can be applied. The second contact member 11B is arranged on the spring 13. Further, the second contact member 11B faces and is apart from the first contact member 11A in the Z direction.

The housing 14 is formed of a metal having good conductivity. Specifically, gold (Au), silver (Ag), copper (Cu), aluminum (Al), and the like can be applied. The housing 14 houses the first contact member 11A, the second contact member 11B, the bimetal 6, the plates (12A and 12B), and the spring 13 as shown in FIG. 4A.

As shown in FIG. 4B, one bimetal 6 is arranged to have a square shape in the housing 14 in plan view in the Z direction, for example. One bimetal 6 may have a rectangular shape.

(Operation of Pin Plunger)

FIG. 4A shows the shape of a pin plunger when the semiconductor device 21 is housed in the IC socket 1 at room temperature. That is, if the semiconductor device 21 is housed in the IC socket 1, the second contact member 11B is pushed by the solder ball 22 and then pushed down in the Z direction. Further, the spring 13 contracts due to the second contact member 11B being pushed down in the Z direction. The spring 13 pushes back the second contact member 11B due to the elastic force (repulsive force) of the spring 13. That is, a contacting pressure is generated at a contact point between the solder ball 22 and the second contact member 11B. In the following description, the force (contacting pressure) acting on the contact point between the solder ball 22 and the second contact member 11B is referred to as "contact pressure".

In the pin plunger 3A, the contact pressure between the solder ball 22 and the second contact member 11B is approximately balanced and stabilized by the elastic force of the spring 13.

(Shape of Pin Plunger at a Low Temperature)

FIG. 4C shows how the shapes of the bimetal 6 and the spring 13 change due to the ambient temperature being changed from room temperature or a high temperature to a low temperature. That is, the spring 13 contracts in the Z direction due to the temperature change. The spring is pushed up in the Z direction by the bimetal 6 being warped. Here, the change of the ambient temperature from a room temperature or a high temperature to a low temperature is referred to as a temperature change.

As shown in FIG. 4C, the bimetal 6 is deformed in an arc shape and is convexly warped by the temperature change. This convex warping means that the center part of the bimetal 6 is curved higher in the Z direction than the ends of the bimetal 6. As shown in FIG. 4C, the thickness T4 of the bimetal 6 in the Z direction is equal to the thickness in the Z direction of the first metal 4 and the second metal 5, which are bonded and convexly warped. That is, the thickness T4 of the bimetal 6 at a low temperature in the Z direction becomes thicker than the thickness T1 of the bimetal 6 at room temperature in the Z direction, for example (T4>T1).

The spring 13 is cooled and contracted due to the temperature change. That is, as shown in FIG. 4C, the length T5 of the spring 13 in the Z direction is the length of the space between the plate 12B and the second contact member 11B at a low temperature. That is, the length T5 of the spring 13 in the Z direction is shorter than the length T2 of the spring 13 before the temperature change in the Z direction (T5<T2).

In FIG. 4C, the length T6 of the space between the plate 12A and the second contact member 11B at a low temperature in the Z direction is specifically the sum of the thickness T4 of the bimetal 6 in the Z direction, the thickness of the plate 12B in the Z direction, and the length T5 of the spring 13 in the Z direction. The decreased length due to the cooling and contracting of the spring 13 and the increased thickness due to the convex warping of the bimetal 6 are substantially equal to each other. Therefore, the length T3 of the space between the plate 12A and the second contact member 11B at room temperature in the Z direction and the length T6 of the space between the plate 12A and the second contact member 11B at a low temperature in the Z direction are substantially equal to each other (T6 T3).

(Operation of Pin Plunger)

FIG. 4C shows the shape of a pin plunger when the contact pressure between the solder ball 22 and the second contact member 11B is stabilized at a low temperature. That is, the spring 13 is cooled and contracted due to the temperature change, and the elastic force of the spring 13 is reduced compared to that at room temperature. The bimetal 6 is deformed in an arc shape and convexly warped by the temperature change and pushes up the plate 12B, the spring 13, and the second contact member 11B.

The elastic force, which is reduced due to the cooling and contracting of the spring 13, can be compensated with the warping force due to the stretching of the first metal 4 and the second metal 5 of the bimetal 6. That is, in the pin plungers 3A, even if the temperature changes, the contact pressure between the solder ball 22 and the second contact member 11B is approximately balanced and stabilized.

Effect of First Embodiment

In the pin plunger according to the first embodiment, the elastic force of the spring is decreased due to the change in the shape of the spring caused by the temperature change. The decrease in the elastic force can be compensated with the warping force due to the stretching of the bimetal. Accordingly, the contact pressure can be stabilized.

First Modified Example of First Embodiment

Figure 5A:
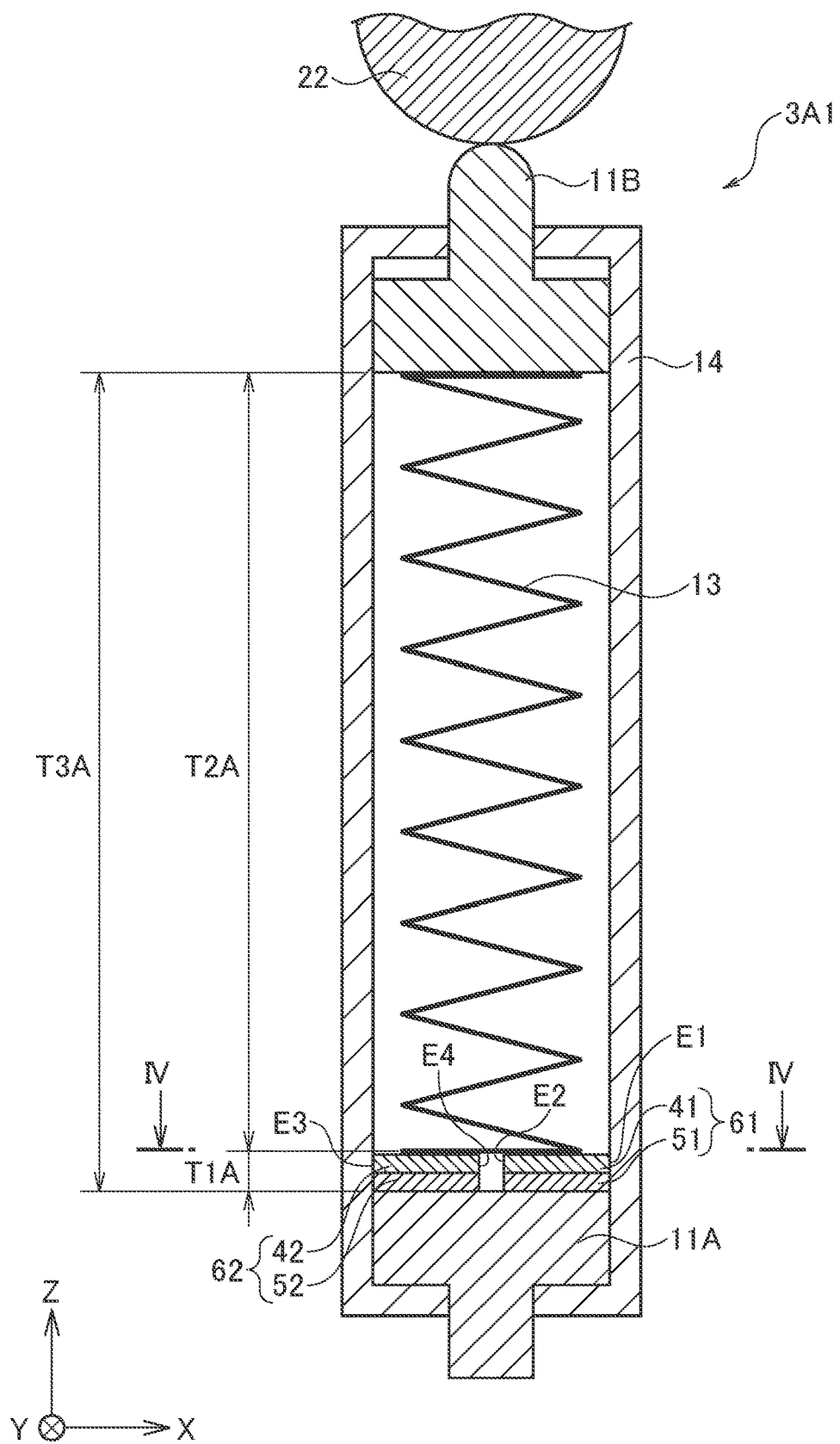
FIG. 5A is a cross sectional view of a pin plunger according to a first modified example of a first embodiment.
Figure 5B:
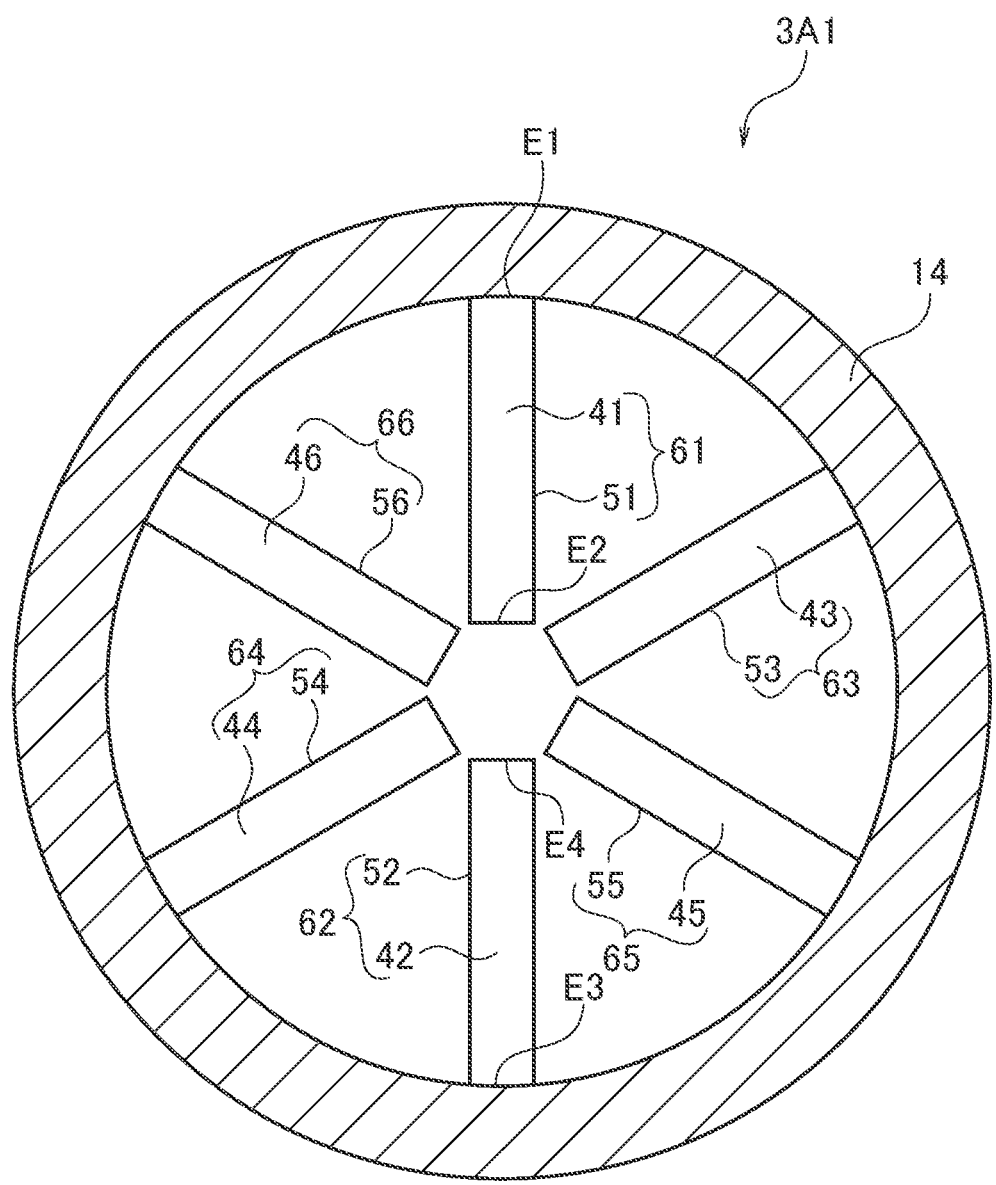
FIG. 5B is a plan view taken along line IV-IV of FIG. 5A.
Figure 5C:
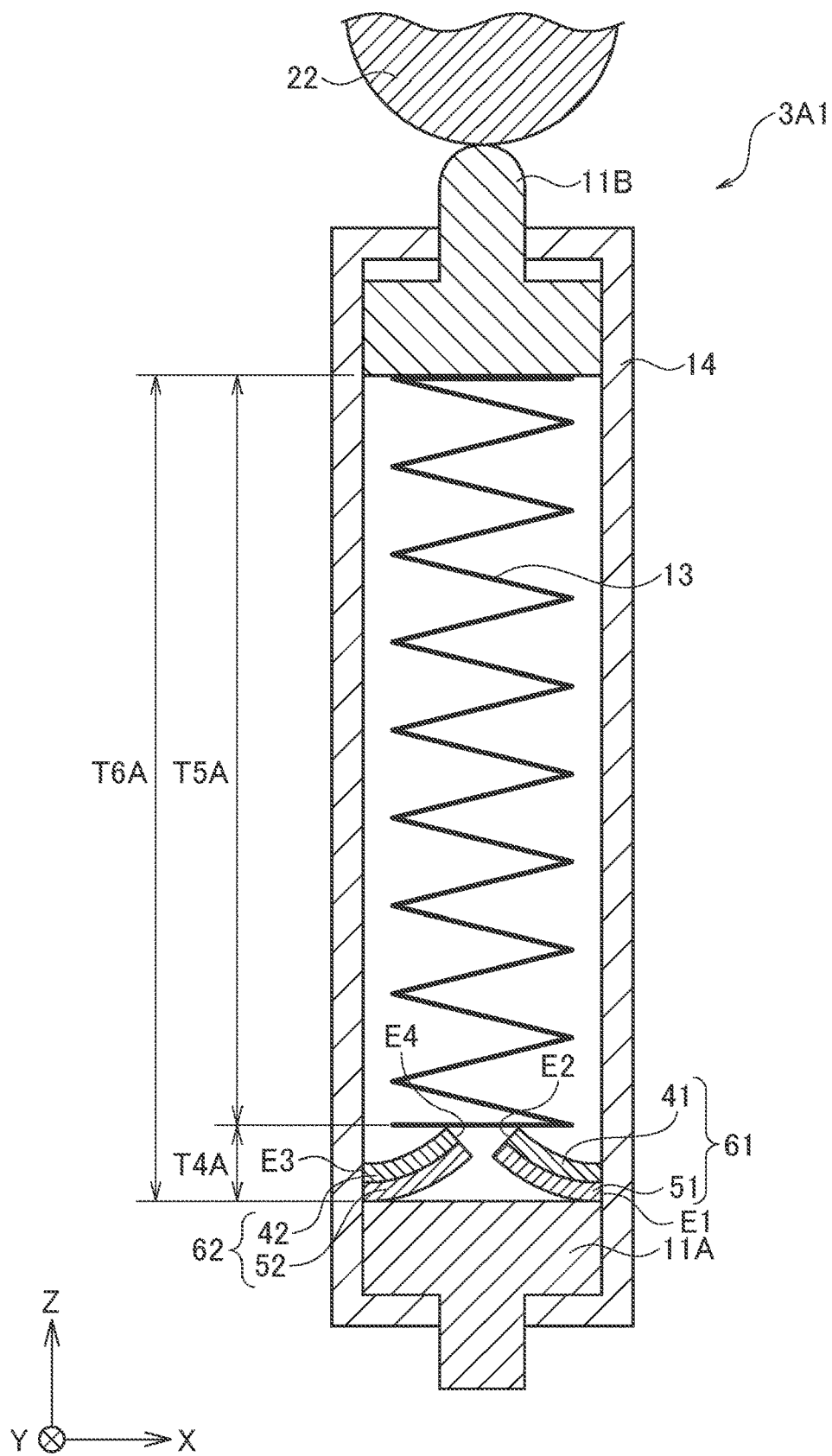
FIG. 5C is a cross sectional view of a pin plunger according to a first modified example of a first embodiment at a low temperature.

FIG. 5A is a cross sectional view of a pin plunger 3A1 according to a first modified example of a first embodiment. FIG. 5B is a plan view taken along line IV-IV of FIG. 5A. FIG. 5C is a cross sectional view of the pin plunger 3A1 according to the first modified example of the first embodiment at a low temperature.

As shown in FIG. 5A, the pin plunger 3A1 according to the first modified example of the first embodiment includes a plurality of divided bimetals 61 and 62 compared to the one bimetal 6 of the pin plunger 3A according to the first embodiment. Although not shown in FIG. 5A, the pin plunger 3A1 may include plates (12A and 12B). Further, since other configurations are the same as those of the first embodiment, the description thereof will be omitted. Although FIG. 5A shows two bimetals 61 and 62 only, a larger number of bimetals are arranged in practice as shown in FIG. 5B.

(Shape of Pin Plunger at Room Temperature)

As shown in FIG. 5A, the bimetals 61 and 62 are formed by bonding the first metals 41 and 42 on the second metals 51 and 52 respectively. The bimetals 61 and 62 are arranged on the first contact member 11A. The thickness T1A of the bimetals 61 and 62 in the Z direction is the sum of the thicknesses of the second metals 51 and 52 and the first metals 41 and 42, which are bonded to each other in the Z direction.

The spring 13 is arranged on the bimetals 61 and 62. As shown in FIG. 5A, the length T2A of the spring 13 in the Z direction is equal to the length of the spring arranged between the bimetals 61 and 62 and the second contact member 11B. As shown in FIG. 5A, the length T3A is the length of a space between the bimetals 61 and 62 and the second contact member 11B at room temperature in the Z direction. The length T3A is specifically the sum of the thickness T1A of the bimetals 61 and 62 in the Z direction and the length T2A of the spring 13 in the Z direction.

The housing 14 includes a plurality of bimetals 61, 62, 63, 64, 65, and 66 therein as shown in FIG. 5B. The bimetal 61 includes a first one end E1 and a first other end E2, for example. Further, the bimetal 62 includes a second one end E3 and a second other end E4.

As shown in FIG. 5B, the plurality of bimetals 61, 62, 63, 64, 65, and 66 are arranged radially in the housing 14 in plan view, for example.

The first one end E1 is in contact with the housing 14 as shown in FIGS. 5A and 5B. Further, the first other end E2 is opposite the first one end E1 and is arranged at the center of the housing 14. The second one end E3 is in contact with the housing 14. Further, the second other end E4 is opposite the second one end E3, and is arranged at the center of the housing 14. At the center of the housing 14, the second other end E4 is opposite and is apart from the first other end E2.

(Operation of Pin Plunger)

The operation of the pin plunger 3A1 at room temperature is the same as that of the pin plunger 3A according to the first embodiment. That is, in the pin plunger 3A1, the contact pressure between the solder ball 22 and the second contact member 11B is approximately balanced and stabilized by the elastic force of the spring 13.

(Shape of Pin Plunger at a Low Temperature)

Suppose that the ambient temperature changes from a room temperature or a high temperature to a low temperature. FIG. 5C shows how, in the above case, the shapes of the bimetals 61 and 62 and the spring 13 change. That is, the spring 13 contracts in the Z direction due to the temperature change. The plurality of bimetals 61 and 62 are warped and thereby push up the spring in the Z direction.

As shown in FIG. 5C, the bimetals 61 and 62 are deformed in an arc shape and concavely warped by the temperature change. This concave warping means, for example, that the other ends E2 and E4 of the bimetals 61 and 62 are curved to a greater extent in the Z direction than the one ends E1 and E3, the one ends E1 and E3 being in contact with the housing 14 and the other ends E2 and E4 opposing the one ends E1 and E3. That is, concave warping forms an arc shape that is curved opposite to the arc shape of the convex warping in the Z direction. As shown in FIG. 5B, each of the plurality of bimetals 61 and 62 has one end that is in contact with the housing 14 and another end that is opposite the one end and is arranged at the center of the housing 14. In the following description, warping to form an arc shape that is curved opposite to an arc shape formed by the convex warping is called concave warping.

As shown in FIG. 5C, the thickness T4A of the bimetals 61 and 62 in the Z direction is equal to the thickness of the second metals 51 and 52 and the first metals 41 and 42, which are bonded to each other and concavely warped in the Z direction. That is, the thickness T4A of the bimetals 61 and 62 at a low temperature in the Z direction becomes thicker than the thickness T1A of the bimetals 61 and 62 at room temperature in the Z direction, for example (T4A>T1A).

The spring 13 is cooled and contracted due to the temperature change. That is, as shown in FIG. 5C, the length T5A of the spring 13 in the Z direction is the length of the space between the bimetals 61 and 62 and the second contact member 11B at a low temperature. That is, the length T5A of the spring 13 in the Z direction is shorter than the length T2A of the spring 13 before the temperature change in the Z direction (T5A<T2A).

The length T6A is the length of the space between the bimetals 61 and 62 and the second contact member 11B at a low temperature in the Z direction. As shown in FIG. 5C, the length T6A is specifically the sum of the thickness T4A of the bimetals 61 and 62 in the Z direction and the length T5A of the spring 13 in the Z direction. That is, the decreased length caused by the cooling and contracting of the spring 13 and the increased thickness generated by the concave warping of the bimetals 61 and 62 are substantially equal. Therefore, the length T3A of the space between the bimetals 61 and 62 and the second contact member 11B at a room temperature in the Z direction and the length T6A of the space between the bimetals 61 and 62 and the second contact member 11B at a low temperature in the Z direction are substantially equal (T6A T3A).

(Operation of Pin Plunger)

FIG. 5C shows the shape of the pin plunger when the contact pressure between the solder ball 22 and the second contact member 11B at a low temperature is stabilized. That is, the spring 13 is cooled and contracted due to the temperature change, and the elastic force of the spring 13 is reduced compared to that at room temperature. The bimetals 61 and 62 are deformed in an arc shape and concavely warped by the temperature change and push up the spring 13 and the second contact member 11B.

The elastic force, which is reduced due to the cooling and contracting of the spring 13, can be compensated with the warping force due to the stretching of the first metals 41 and 42 and the second metals 51 and 52 of the bimetals 61 and 62. That is, in the pin plunger 3A1, even if the temperature changes, the contact pressure between the solder ball 22 and the second contact member 11B is approximately balanced and stabilized.

Effect of First Modified Example of First Embodiment

In the pin plunger according to the first modified example of the first embodiment, the decrease in the elastic force due to the change in the shape of the spring caused by the temperature change can be compensated with the warping force due to the stretching of the plurality of bimetals. Accordingly, it is possible to stabilize the contact pressure.

Second Modified Example of First Embodiment

Figure 6A:
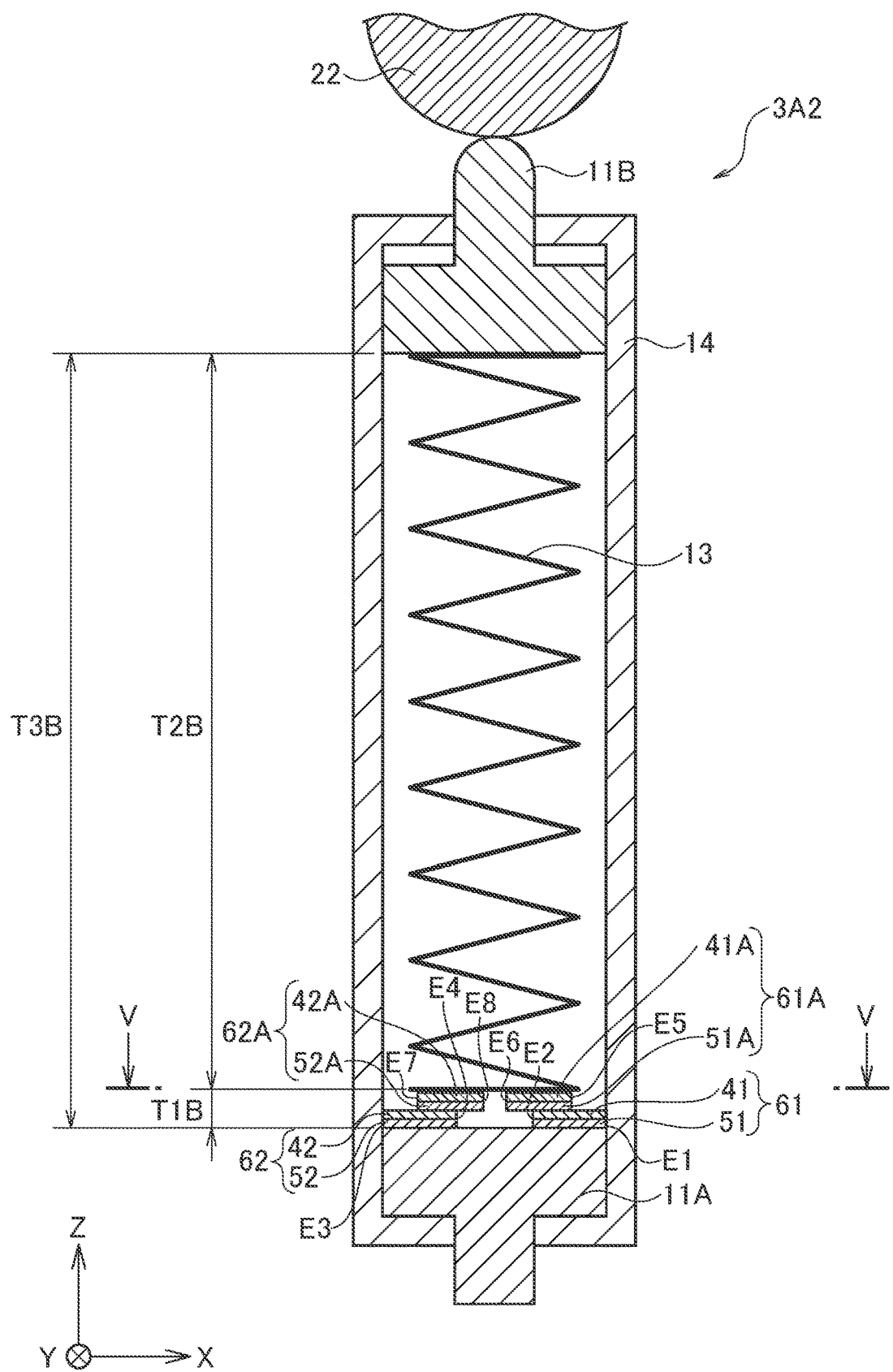
FIG. 6A is a cross sectional view of a pin plunger according to a second modified example of a first embodiment.
Figure 6B:
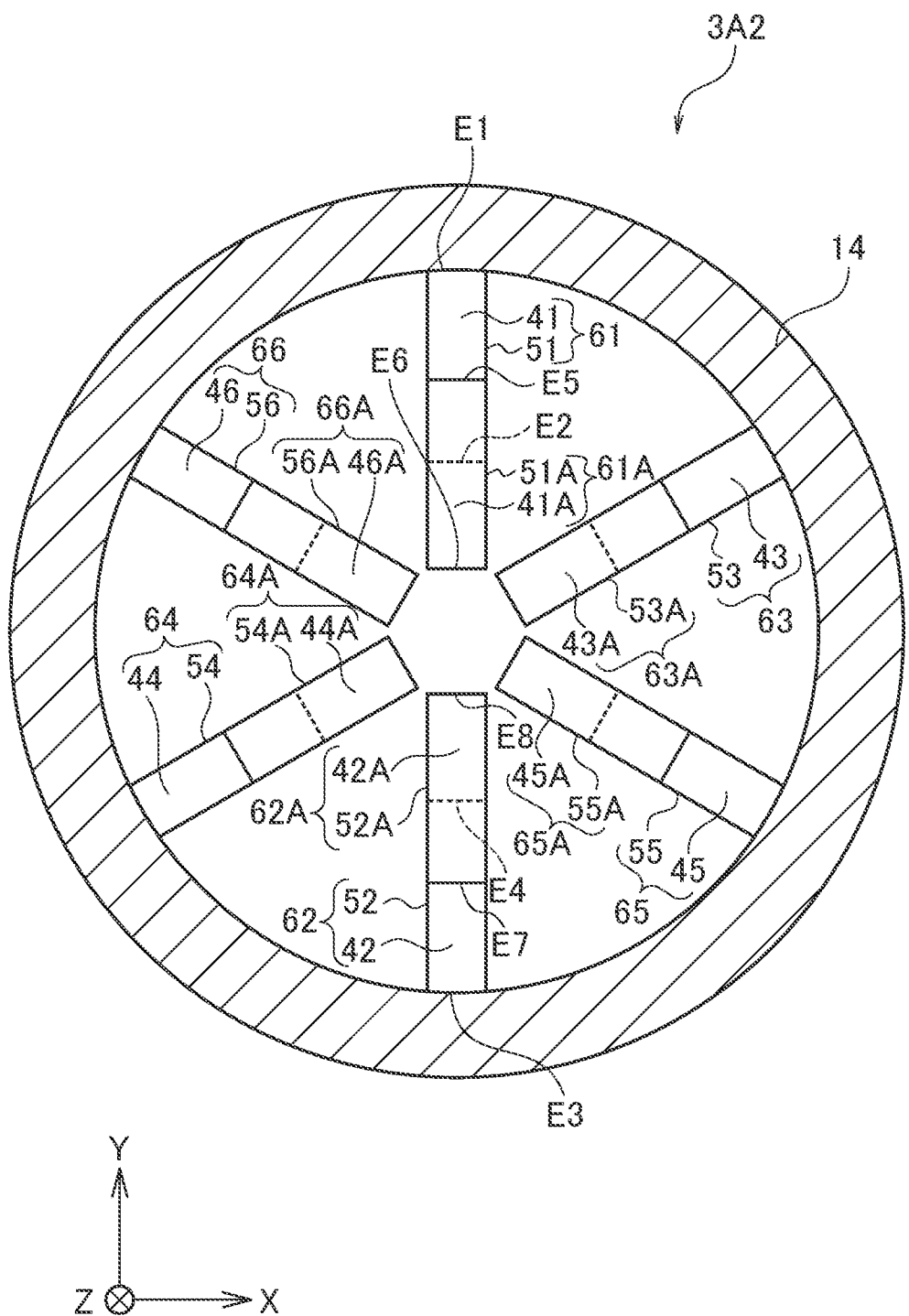
FIG. 6B is a plan view taken along line V-V of FIG. 6A.
Figure 6C:
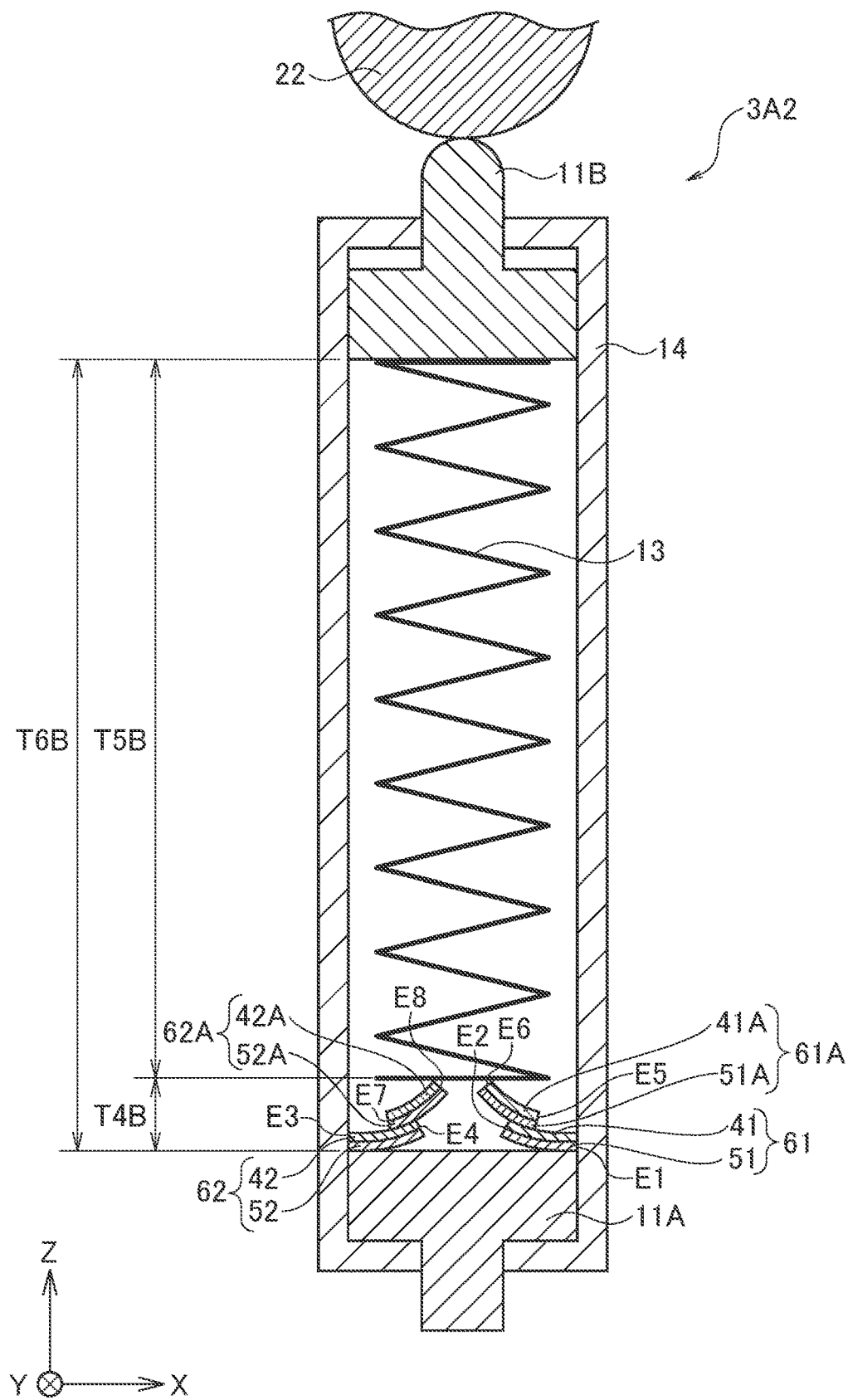
FIG. 6C is a cross sectional view of a pin plunger according to a second modified example of a first embodiment at a low temperature.

FIG. 6A is a cross sectional view of a pin plunger 3A2 according to a second modified example of the first embodiment. FIG. 6B is a plan view taken along line V-V of FIG. 6A. FIG. 6C is a cross sectional view showing the shape of the pin plunger 3A2 according to the second modified example of the first embodiment at a low temperature.

The pin plunger 3A2 according to the second modified example of the first embodiment differs from the pin plunger 3A1 according to the first modified example of the first embodiment in further including a plurality of divided auxiliary bimetals 61A and 62A as shown in FIG. 6A. Although not shown in FIG. 6A, the pin plunger 3A2 may have plates (12A and 12B). Further, since other configurations are the same as those of the first modified example of the first embodiment, the description thereof will be omitted. FIG. 6A only shows the two auxiliary bimetals 61A and 62A, but a larger number of auxiliary bimetals are arranged in practice as shown in FIG. 6B.

(Shape of Pin Plunger at Room Temperature)

As shown in FIG. 6A, the auxiliary bimetals 61A and 62A are formed by bonding first metals 41A and 42A on second metals 51A and 52A respectively. The auxiliary bimetals 61A and 62A are arranged on the bimetals 61 and 62 respectively. The thickness T1B of the bimetals 61 and 62 and the auxiliary bimetals 61A and 62A in the Z direction is the sum of the thicknesses of the second metals 51 and 52 and the first metals 41 and 42, which are bonded to each other, and the thicknesses of the second metals 51A and 52A and the first metals 41A and 42A, which are bonded to each other.

The spring 13 is arranged on the auxiliary bimetals 61A and 62A. As shown in FIG. 6A, the length T2B of the spring 13 in the Z direction is equal to the length of the spring 13 arranged between the auxiliary bimetals 61A and 62A and the second contact member 11B.

The length T3B is the length of a space between the auxiliary bimetals 61A and 62A and the second contact member 11B at room temperature in the Z direction. As shown in FIG. 6A, the length T3B is specifically the sum of the thickness T1B of the bimetals 61 and 62 and the auxiliary bimetals 61A and 62A in the Z direction and the length T2B of the spring 13 in the Z direction.

As shown in FIG. 6B, auxiliary bimetals 61A, 62A, 63A, 64A, 65A, and 66A are arranged inside the housing 14. As shown in FIGS. 6A and 6B, the auxiliary bimetal 61A includes a third one end E5 and a third other end E6. Further the auxiliary bimetal 62A includes a fourth one end E7 and a fourth other end E8.

As shown in FIG. 6B, the plurality of auxiliary bimetals 61A, 62A, 63A, 64A, 65A, and 66A may be arranged radially in the housing 14 in plan view. Further, one ends of the plurality of auxiliary bimetals 61A, 62A, 63A, 64A, 65A, and 66A are laminated on the bimetals 61, 62, 63, 64, 65, and 66 respectively. The other end of each of the auxiliary bimetals 61A, 62A, 63A, 64A, 65A, and 66A is opposite each one end and may be arranged at the center of the housing 14.

As shown in FIGS. 6A and 6B, the third one end E5 is arranged on the bimetal 6 having the first one end E1 and the first other end E2. Further, the third other end E6 is opposite the third one end E5 and is arranged at the center of the housing 14. The fourth one end E7 is arranged on the bimetal 6 having the second one end E3 and the second other end E4. The fourth other end E8 is opposite the fourth one end E7 and is arranged at the center of the housing 14. Further, at the center of the housing 14, the fourth other end E8 is opposite and is apart from the third other end E6.

(Operation of Pin Plunger)

The operation of the pin plunger 3A2 at a room temperature is similar to that of the pin plunger 3A according to the first embodiment. That is, in the pin plunger 3A2, the contact pressure between the solder ball 22 and the second contact member 11B is approximately balanced and stabilized by the elastic force of the spring 13.

(Shape of Pin Plunger at a Low Temperature)

Suppose that the ambient temperature changes from a room temperature or a high temperature to a low temperature. FIG. 6C shows how, in the above case, the shapes of the bimetals 61 and 62, the auxiliary bimetals 61A and 62A, and the spring 13 change. That is, the spring 13 contracts in the Z direction due to the temperature change. The plurality of bimetals 61 and 62 and the plurality of auxiliary bimetals 61A and 62A are warped and thereby push up the spring in the Z direction.

As shown in FIG. 6C, the auxiliary bimetals 61A and 62A are deformed in an arc shape and concavely warped due to the temperature change.

The thickness T4B is the thickness of the bimetals 61 and 62 and the auxiliary bimetals 61A and 62A in the Z direction. As shown in FIG. 6C, the thickness T4B is equal to the thickness of the second metals 51, 52, 51A, and 52A and the first metals 41, 42, 41A, and 42A, which are bonded to each other and are concavely warped in the Z direction. That is, the thickness T4B of the bimetals 61 and 62 and the auxiliary bimetals 61A and 62A at a low temperature in the Z direction is thicker than the thickness T1B of the bimetals 61 and 62 and the auxiliary bimetals 61A and 62A at a room temperature in the Z direction, for example (T4B>T1B).

The spring 13 is cooled and contracted due to the temperature change. That is, as shown in FIG. 6C, the length T5B of the spring 13 in the Z direction is the length of the space between the auxiliary bimetals 61A and 62A and the second contact member 11B at a low temperature. That is, the length T5B of the spring 13 in the Z direction is shorter than the length T2B of the spring 13 before the temperature change in the Z direction (T5B<T2B).

The length T6B is the length of the space between the auxiliary bimetals 61A and 62A and the second contact member 11B at a low temperature in the Z direction. As shown in FIG. 6C, the length T6B is specifically the sum of the thickness T4B of the bimetals 61 and 62 and the auxiliary bimetals 61A and 62A in the Z direction and the length T5B of the spring 13 in the Z direction. That is, the decreased length which occurs due to the cooling and contracting of the spring 13 and the increased length which is generated by the concave warping of the bimetals 61 and 62 and the auxiliary bimetals 61A and 62A are substantially equal. Therefore, the length T3B of the space between the bimetals 61 and 62 and the second contact member 11B at room temperature in the Z direction and the length T6B of the space between the bimetals 61 and 62 and the second contact member 11B at a low temperature in the Z direction are substantially equal (T6A≈T3A).

(Operation of Pin Plunger)

FIG. 6C shows the shape of the pin plunger when the contact pressure between the solder ball 22 and the second contact member 11B at a low temperature is stabilized. That is, the spring 13 is cooled and contracted due to the temperature change, and the elastic force of the spring 13 is reduced compared to that at room temperature. The bimetals 61 and 62 are deformed in an arc shape and concavely warped due to the temperature change and push up the spring 13 and the second contact member 11B. Further, the auxiliary bimetals 61A and 62A are deformed in an arc shape and concavely warped due to the temperature change and push up the spring 13 and the second contact member 11B.

The elastic force reduced by the cooling and contracting of the spring 13 can be compensated with the warping force due to the stretching of the metals based on the laminated structure of the first metals 41, 42, 41A, and 42A and the second metals 51, 52, 51A, and 52A of the bimetals 61 and 62 and the auxiliary bimetals 61A and 62A. That is, in the pin plunger 3A2, even if the temperature changes, the contact pressure between the solder ball 22 and the second contact member 11B is approximately balanced and stabilized.

Effect of Second Modified Example of First Embodiment

In accordance with the pin plunger according to the second modified example of the first embodiment, even if the elastic force of the spring is decreased due to a change in the shape of the spring caused by a temperature change, the decreased elastic force can be compensated with the warping force due to the stretching of the plurality of bimetals. Accordingly, it is possible to stabilize the contact pressure.

Further, in accordance with the pin plunger according to the second modified example of the first embodiment, even if the elastic force of the spring is decreased due to a change in the shape of the spring caused by a temperature change, the decreased elastic force can be compensated with the warping force due to the stretching of the plurality of auxiliary bimetals. Accordingly, it is also possible to stabilize the contact pressure.

Second Embodiment (Configuration of IC Socket)

Figure 7:
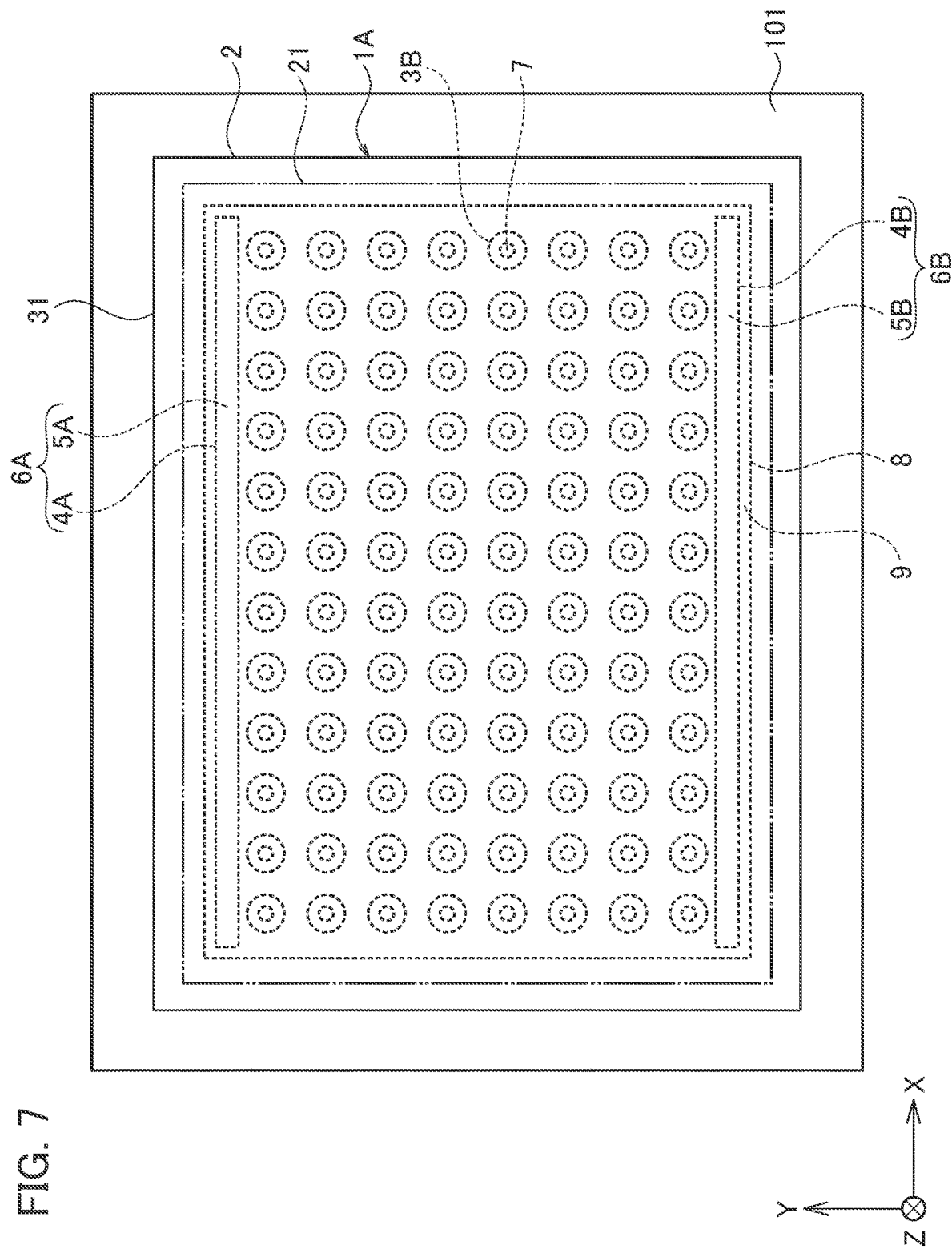
FIG. 7 is a schematic plan view showing the layout of an IC socket according to a second embodiment.

FIG. 7 is an example of a schematic plan view showing the layout of an IC socket 1A according to a second embodiment.

The IC socket 1A according to the second embodiment includes pin plungers 3B as shown in FIG. 7. Further, the IC socket 1A according to the second embodiment includes a fixing plate 8, bimetals 6A and 6B, and a housing adjusting plate 9 outside the pin plungers 3B. Other configurations of the second embodiment are the same as those of the first embodiment, and therefore description thereof will be omitted.

As shown in FIG. 7, the bimetal 6A arranged at the upper portion in the Y direction and the bimetal 6B arranged at the lower portion in the Y direction may be arranged with the plurality of pin plungers 3B therebetween. The bimetals 6A and 6B may be arranged at the left and right ends in the X direction with the plurality of pin plungers 3B therebetween.

The configurations of the pin plungers 3B, the fixing plate 8, and the housing adjusting plate 9 will be described in detail in the description of FIG. 8A, for example.

(Configuration of Pin Plunger)

FIG. 8A is an example of a schematic cross sectional view of the pin plungers 3B according to the second embodiment. FIG. 8B is an example of a plan view of FIG. 8A. FIG. 8C is an example of a cross sectional view of the pin plungers 3B according to the second embodiment at a low temperature. FIGS. 8A and 8C are cross sectional views taken along line VI-VI of FIG. 8B.

(Shape of Pin Plunger at a Room Temperature)

As shown in FIG. 8A, each pin plunger 3B includes a first contact member 11A, a second contact member 11B, a spring 13, and a housing 14. In the housing 14, the first contact member 11A, the second contact member 11B, and the spring 13 are arranged. Further, as shown in FIG. 8A, a bimetal 6A, a fixing plate 8, and a housing adjusting plate 9 are arranged outside the housing 14. As shown in FIG. 8A, each pin plunger 3B is arranged on a socket pin 7 (not shown). Further, each pin plunger 3B is electrically connected to a socket pin 7 and a solder ball 22. A current that flows through each pin plunger 3B mainly flows from the solder ball 22 to the housing 14 with the second contact member 11B therebetween. Further, the current that flows through each pin plunger 3B flows mainly from the housing 14 to the socket pin 7 (not shown) with the first contact member 11A therebetween.

The fixing plate 8 is formed of a metal or an insulating substrate. As shown in FIG. 8A, the fixing plate 8 is arranged in contact with the bimetal 6A. More specifically, the fixing plate 8 can maintain flatness in the X and Y directions outside the housing 14 even if the shape of the bimetal 6A changes due to a temperature change.

As shown in FIG. 8A, the bimetal 6A is arranged by bonding a second metal 5A on a first metal 4A. Further, the bimetal 6A is arranged on the fixing plate 8. As shown in FIG. 8A, the thickness T7 of the bimetal 6A in the Z direction is the sum of the thicknesses of the first metal 4 and the second metal 5 in the Z direction. Although a bimetal 6B is not shown in FIG. 8A, the bimetal 6B may be formed by bonding a second metal 5B on a first metal 4B in the same manner as the bimetal 6A. Further, the bimetal 6B may be arranged on the fixing plate 8. The thickness of the bimetal 6B at a room temperature in the Z direction is substantially equal to the thickness T7 of the bimetal 6A in the Z direction.

The housing adjusting plate 9 is formed of a metal or insulating substrate. As shown in FIG. 8A, the housing adjusting plate 9 is arranged on the bimetal 6A. Further, the housing adjusting plate 9 is arranged in contact with the housing 14. The housing adjusting plate 9 may be arranged on the bimetal 6B (not shown). That is, the housing adjusting plate 9 is moved up and down in the Z direction by a change in shape due to warping of the bimetals 6A and 6B. In conjunction with the above movement of the housing adjusting plate 9, the housing 14 can also be moved up and down in the Z direction.

The spring 13 is arranged on the first contact member 11A. Further, the spring 13 is arranged between the first contact member 11A and the second contact member 11B.

As shown in FIG. 8A, the housing 14 houses the first contact member 11A, the second contact member 11B, and the spring 13.

As shown in FIG. 8B, the bimetals 6A and 6B are arranged to be apart from each other to sandwich the housings 14, which extend in the Z direction, in plan view from the outside in the Y direction on the X-Y plane.

As shown in FIGS. 8A and 8B, the fixing plate 8 and the housing adjusting plate 9 are provided outside the plurality of housings 14 in plan view. That is, the fixing plate 8 is arranged to be apart from the outside of each of the plurality of housings 14 on the X-Y plane. Further, the housing adjusting plate 9 is arranged to be adhered to the outside of each of the plurality of housings 14 on the X-Y plane. The fixing plate 8 and the housing adjusting plate 9 may be provided inside a socket body 2 (not shown).

(Operation of Pin Plunger)

The operation of each pin plunger 3B at a room temperature is the same as that of each pin plunger 3A according to the first embodiment. That is, in each pin plunger 3B, the contact pressure between each solder ball 22 and the second contact member 11B is approximately balanced and stabilized by the elastic force of the spring 13.

(Shape of Pin Plunger at a Low Temperature)

Suppose that the ambient temperature changes from a room temperature or a high temperature to a low temperature. FIG. 8C shows, in the above case, how the shapes of the bimetal 6A and the spring 13 change. That is, the spring 13 contracts in the Z direction due to the temperature change and the bimetal 6A and the bimetal 6B (not shown) are warped. Accordingly, the entire pin plunger 3B is pushed up in the Z direction.

As shown in FIG. 8C, the bimetal 6A is deformed in an arc shape and convexly warped by the temperature change. As shown in FIG. 8C, the length T8 of the bimetal 6 in the thickness direction is substantially equal to the sum of the thickness of the first metal 4 and the second metal 5, which are bonded each other and convexly warped in the Z direction. That is, the thickness T8 of the bimetal 6 at a low temperature in the Z direction becomes thicker than the thickness T7 of the bimetal 6 at room temperature in the Z direction, for example (T8>T7). The bimetal 6B (not shown) may be deformed in an arc shape and convexly warped by the temperature change as similar to the bimetal 6A. The thickness of the bimetal 6B at a low temperature in the Z direction is substantially equal to the thickness T8 of the bimetal 6A in the Z direction.

(Operation of Pin Plunger)

FIG. 8C shows a shape of the pin plungers when the contact pressure between each solder ball 22 and the second contact member 11B at a low temperature is stabilized. That is, the spring 13 is cooled and contracted due to the temperature change. The elastic force of the spring 13 becomes weaker than that at a room temperature. The bimetals 6A and 6B are deformed in an arc shape and convexly warped by the temperature change. Accordingly, the housing adjusting plate 9 is pushed up in the Z direction. The housing adjusting plate 9 is in contact with the housing 14, and therefore each entire pin plunger 3B is pushed up in the Z direction also.

The elastic force, which is reduced by cooling and contracting of the spring 13, can be compensated with the warping force due to the stretching of the first metals 4A and 4B and the second metals 5A and 5B of the bimetals 6A and 6B. That is, in each pin plunger 3B, even if the temperature changes, the contact pressure between each solder ball 22 and the second contact member 11B is balanced and stabilized.

Effect of Second Embodiment

In the pin plunger according to the second embodiment, the decrease in the elastic force due to the change in the shape of the spring caused by a temperature change can be compensated with the warping force due to the stretching of the bimetals. Accordingly, it is possible to stabilize the contact pressure.

Other Embodiments

While certain embodiments have been described, these embodiments have been presented by way of examples only, and are not intended to limit the scope of the inventions. Indeed, these novel embodiments described herein may be embodied in a variety of other forms; furthermore, various omissions, substitutions, and changes may be made without departing from the spirit of the inventions. These embodiments and variations thereof are included in the scope and the gist of the invention and are also included in the scope of the invention described in the claims and their equivalents.

The bimetals 6, 6A, and 6B in the case where the temperature changes from a room temperature or a high temperature to a low temperature have been described as a representative example. However, another example may be the case where the temperature changes from a low temperature or a room temperature to a high temperature. That is, the elastic force, which is increased by heating and expanding of the spring 13, is compensated with the warping force due to stretching of the first metals 4, 4A, and 4B and the second metals 5, 5A, and 5B. Specifically, the bimetals 6, 6A, and 6B are formed in a convex or concave warped shape at a low temperature or room temperature. Meanwhile, suppose that the spring 13 at a high temperature is heated and expanded due to a temperature change and the elastic force becomes strong. Even in the above case, the elastic force of the spring 13 can be alleviated and compensated by returning the shape of the bimetal 6, 6A, and 6B from the warped shape to the flat shape.

What is claimed is:
1. A pin plunger comprising:
a first contact member;
a second contact member that faces the first contact member and is apart from the first contact member;
a spring arranged between the first contact member and the second contact member; and
a housing that houses the first contact member, the second contact member, and the spring, wherein
the housing comprises a bimetal inside or outside the housing,
the bimetal comprises a first metal and a second metal, the first metal having a thermal expansion coefficient different from a thermal expansion coefficient of the second metal, and
an elastic force decreased or increased by contracting or expanding of the spring due to a temperature change is compensated with a warping force due to stretching of the first metal and the second metal.
2. The pin plunger according to claim 1, wherein
the bimetal arranged by bonding the second metal on the first metal,
the first metal includes a thermal expansion coefficient larger than a thermal expansion coefficient of the second metal, and
a cross section of the first metal and the second metal includes a convexly warped arc shape due to a temperature change.
3. The pin plunger according to claim 1, wherein
the bimetal arranged by bonding the first metal on the second metal,
the first metal includes a thermal expansion coefficient larger than a thermal expansion coefficient of the second metal, and
a cross section of the first metal and the second metal includes a concavely warped arc shape due to a temperature change.
4. The pin plunger according to claim 1, wherein the bimetal is arranged inside the housing in plan view.

5. The pin plunger according to claim 4, wherein
the bimetal is provided in plurality in the pin plunger, the bimetals include:
a first one end of a bimetal that is in contact with the housing;
a first other end of the bimetal that is opposite the first one end;
a second one end of a bimetal that is in contact with the housing; and
a second other end of the bimetal that is opposite the second one end and that faces and is apart from the first other end, and
the plurality of bimetals are arranged radially in plan view.
6. The pin plunger according to claim 5, wherein
a plurality of auxiliary bimetals are further provided,
the auxiliary bimetals include:
a third one end of an auxiliary bimetal that is in contact on the bimetal which includes the first one end and the first other end;
a third other end of the auxiliary bimetal that is opposite the third one end;
a fourth one end of an auxiliary bimetal that is in contact on the bimetal which includes the second one end and the second other end; and
a fourth other end of the auxiliary bimetal that is opposite the fourth one end, and
the plurality of auxiliary bimetals laminated on the plurality of bimetals are radially arranged in plan view.
7. The pin plunger according to claim 6, wherein
each auxiliary bimetal is arranged by bonding the first metal on the second metal,
the first metal has a thermal expansion coefficient larger than a thermal expansion coefficient of the second metal, and
a cross section of the first metal and the second metal includes a concavely warped arc shape due to a temperature change.
8. The pin plunger according to claim 6, wherein
the auxiliary bimetals are arranged inside the housing in plan view.
9. The pin plunger according to claim 1, wherein:
a fixing plate that is arranged outside the housing is provided;
the bimetal arranged on the fixing plate is provided; and
a housing adjusting plate that is arranged on the bimetal, is in contact with the housing, and is arranged outside the housing is provided.
10. The pin plunger according to claim 9, wherein
the bimetal is provided in plurality, and the bimetals are arranged outside the housing in plan view, are apart from each other to sandwich the housing, and are arranged on the fixing plate.
11. The pin plunger according to claim 10, wherein
the bimetals are arranged to be apart from each other and sandwich the housing, which extends in a thickness direction, from outside in a short-side direction in plan view.
12. The pin plunger according to claim 11, wherein
the fixing plate and the housing adjusting plate are provided outside a plurality of housings in plan view,
the fixing plate is arranged to be apart from outside of each of the plurality of housings, and
the housing adjusting plate is arranged to be adhered to outside of each of the plurality of housings.

13. A pin plunger comprising:
a first contact member;
a second contact member that faces and is apart from the first contact member;
a spring arranged between the first contact member and the second contact member;
a housing that houses the first contact member, the second contact member, and the spring;
a fixing plate arranged outside the housing;
a bimetal arranged on the fixing plate; and
a housing adjusting plate arranged on the bimetal, in contact with the housing, and arranged outside the housing, wherein
the bimetal comprises a first metal and a second metal, the first metal having a thermal expansion coefficient different from a thermal expansion coefficient of the second metal, and
an elastic force decreased or increased by contracting or expanding of the spring due to a temperature change is compensated with a warping force due to stretching of the first metal and the second metal.

14. The pin plunger according to claim 13, wherein
the bimetal is provided in plurality, and the bimetals are arranged outside the housing in plan view, are apart from each other to sandwich the housing, and are arranged on the fixing plate.

15. The pin plunger according to claim 14, wherein
the bimetals are arranged to be apart from each other and sandwich the housing, which extends in a thickness direction, from outside in a short-side direction in plan view.

16. The pin plunger according to claim 15, wherein
the fixing plate and the housing adjusting plate are provided outside a plurality of housings in plan view,
the fixing plate is arranged to be apart from outside of each of the plurality of housings, and
the housing adjusting plate is arranged to be adhered to outside of each of the plurality of housings.

17. The pin plunger according to claim 13, wherein
the bimetal is arranged by bonding the second metal on the first metal,
the first metal has a thermal expansion coefficient which is larger than a thermal expansion coefficient of the second metal, and
a cross section of the first metal and the second metal includes a convexly warped arc shape due to a temperature change.

18. The pin plunger according to claim 13, wherein
the bimetal is arranged by bonding the first metal on the second metal,
the first metal has a thermal expansion coefficient that is larger than a thermal expansion coefficient of the second metal, and
a cross section of the first metal and the second metal includes a concavely warped arc shape due to a temperature change.

19. An IC socket comprising:
a wiring board that comprises wiring;
a socket pin arranged on the wiring and electrically connected to the wiring;
a pin plunger arranged on the socket pin and electrically connected to the socket pin; and
a socket body that comprises the socket pin and the pin plunger which are provided in a predetermined arrangement, wherein
the pin plunger comprises
a first contact member;
a second contact member that faces the first contact member and is apart from the first contact member;
a spring arranged between the first contact member and the second contact member; and
a housing that houses the first contact member, the second contact member, and the spring,
the housing includes a bimetal inside or outside the housing,
the bimetal includes a first metal and a second metal, the first metal having a thermal expansion coefficient which is different from a thermal expansion coefficient of the second metal; and
an elastic force decreased or increased by contracting or expanding of the spring due to a temperature change is compensated with a warping force due to stretching of the first metal and the second metal.

20. The IC socket according to claim 19, further comprising:
a fixing plate arranged outside the housing;
the bimetal arranged on the fixing plate; and
a housing adjusting plate arranged on the bimetal, in contact with the housing, and arranged outside the housing.

* * * * *